United States Patent
Zhou

(10) Patent No.: US 11,164,798 B2
(45) Date of Patent: Nov. 2, 2021

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 30 days.

(21) Appl. No.: 16/601,866

(22) Filed: Oct. 15, 2019

(65) Prior Publication Data

US 2020/0161192 A1 May 21, 2020

(30) Foreign Application Priority Data

Nov. 20, 2018 (CN) .......................... 201811382929.X

(51) Int. Cl.
*H01L 21/8238* (2006.01)
*H01L 29/78* (2006.01)
*H01L 27/092* (2006.01)
*H01L 29/66* (2006.01)
*H01L 29/786* (2006.01)
(Continued)

(52) U.S. Cl.
CPC ......... *H01L 21/823878* (2013.01); *H01L 21/823821* (2013.01); *H01L 21/823885* (2013.01); *H01L 27/0924* (2013.01); *H01L 29/66795* (2013.01); *H01L 29/785* (2013.01); *H01L 29/78642* (2013.01); *H01L 21/823456* (2013.01); *H01L 21/823487* (2013.01); *H01L 27/088* (2013.01);
(Continued)

(58) Field of Classification Search
CPC ............... H01L 29/7827; H01L 27/088; H01L 21/823487; H01L 21/823456; H01L 29/66666; H01L 29/42392; H01L 29/78642

See application file for complete search history.

(56) References Cited

U.S. PATENT DOCUMENTS 9,893,207 B1 * 2/2018 Balakrishnan ........ H01L 27/092
10,134,863 B2 * 11/2018 Lin ................... H01L 29/42392
(Continued)

*Primary Examiner* — Nicholas J Tobergte
(74) *Attorney, Agent, or Firm* — Anova Law Group, PLLC

(57) ABSTRACT

Semiconductor devices and fabrication methods are provided. An exemplary fabrication method includes providing a semiconductor substrate having a first device region and a second device region; forming a first doped layer on the semiconductor substrate; forming a first fin layer on the first doped layer in the first device region; forming a second fin layer on the first doped layer in the second device region; forming a first isolation layer on the first doped layer in the first device region and covering sidewall surfaces of the first fin layer; forming a second isolation layer on the second doped layer in the second device region and covering portions of sidewall surfaces of the second fin layer and with a thickness smaller than a thickness of the first isolation layer; and forming a first gate structure on the first isolation layer and a second gate structure on the second isolation layer.

20 Claims, 5 Drawing Sheets

(51) Int. Cl.
*H01L 29/423* (2006.01)
*H01L 21/8234* (2006.01)
*H01L 27/088* (2006.01)

(52) U.S. Cl.
CPC .. *H01L 29/42392* (2013.01); *H01L 29/66666* (2013.01)

(56) References Cited

U.S. PATENT DOCUMENTS

| | | | |
|---|---|---|---|
| 10,141,232 B2 * | 11/2018 | Lee | H01L 29/513 |
| 2013/0069112 A1 * | 3/2013 | Zhu | H01L 21/845 257/192 |
| 2015/0295040 A1 * | 10/2015 | Tsai | H01L 21/823807 257/371 |
| 2016/0293739 A1 * | 10/2016 | Zhang | H01L 27/0814 |
| 2020/0058747 A1 * | 2/2020 | Fang | H01L 21/76816 |

* cited by examiner

US 11,164,798 B2

SEMICONDUCTOR DEVICE AND FABRICATION METHOD THEREOF

CROSS-REFERENCES TO RELATED APPLICATIONS

This application claims the priority of Chinese patent application No. 201811382929.X, filed on Nov. 20, 2018, the entirety of which is incorporated herein by reference.

FIELD OF THE DISCLOSURE

The present disclosure generally relates to the field of semiconductor manufacturing and, more particularly, relates to semiconductor devices and fabrication methods.

BACKGROUND

With the rapid development of the semiconductor manufacturing technologies, integrated circuits (ICs) are being developed toward higher component densities and higher integration level. As one of the basic components of ICs, semiconductor devices are widely used. The conventional planar device usually has a weak control on its channel current, and the short channel effect (SCE) is easy to occur to have a leakage current issue. Thus, the electrical performance of the semiconductor device is adversely affected.

To overcome the short channel effect of the semiconductor devices and suppress the leakage current, fin field-effect transistors (FinFETs) have been developed. FinFETs are a common type of multi-gate devices. The structure of an FinFET often includes a plurality of fins and an isolation layer on a surface of a semiconductor substrate. The isolation layer covers portions of sidewall surfaces of the plurality fins, and the surface of the isolation layer is lower than the top surfaces of the plurality of fins. The FinFET also includes a gate structure on the surface of the isolation layer and covering the top and sidewall surfaces of the fins and source/drain regions in the fins at both sides of the gate structure.

With the ever-increasing demands placed on the device performance, a four-sided controlled gate-all-around structure has been developed. A semiconductor device having a gate-all-around structure has a special performance that effectively suppresses the short channel effect, and is expected by the semiconductor industry to continue to reduce the size of the device in accordance with the Moore's Law. In the gate-all-around structure, the device channel formed by a thin silicon film is surrounded by the gate of the device; and is only controlled by the gate.

However, there is a need to further improve the performance of the semiconductor device with the gate-all-around structure. The disclosed methods and semiconductor devices are directed to solve one or more problems set forth above and other problems in the art.

BRIEF SUMMARY OF THE DISCLOSURE

One aspect of the present disclosure includes a method for forming a semiconductor device. The method may include providing a semiconductor substrate having a first device region and a second device region; forming a first doped layer on the semiconductor substrate; forming a first fin layer on a portion of the first doped layer in the first device region; forming a second fin layer on a portion of the first doped layer in the second device region; forming a first isolation layer on the portion of the first doped layer in the first device region and covering portions of sidewall surfaces of the first fin layer; forming a second isolation layer on the portion of the first doped layer in the second device region and covering portions of the sidewall surfaces of the second fin layer and with a thickness smaller than a thickness of the first isolation layer; forming a first gate structure on the first isolation layer and covering portions of the sidewall surfaces of the first fin layer and a portion of the first isolation layer; forming a second gate structure on the second isolation layer and covering portions of the sidewall surfaces of the second fin layer and a portion of the second isolation layer; forming a second doped layer on the first fin layer; and forming a third doped layer on the second fin layer.

Another aspect of the present disclosure includes a semiconductor device. The semiconductor device includes a semiconductor substrate having a first device region and a second device region; a first doped layer formed on a surface of the semiconductor substrate; a first fin layer formed on a portion of the first doped layer in the first device region; a second fin layer formed on a portion of the first doped layer in the second device region; a first isolation layer formed on a portion of the first doped layer in the first device region and covering portions of sidewall surfaces of the first fin layer; a second isolation layer formed on a portion of the first doped layer and covering portions of the sidewall surfaces of the second fin layer and with a thickness smaller than a thickness of the first isolation layer; a first gate structure formed on the first isolation layer and covering portions of the sidewall surface of the first fin layer and a portion of the first isolation layer; a second gate structure formed on the second isolation layer and covering portions of the sidewall surfaces of the first fin layer and a portion of the second isolation layer; a second doped layer formed on the first fin layer; and a third doped layer formed on the second fin layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
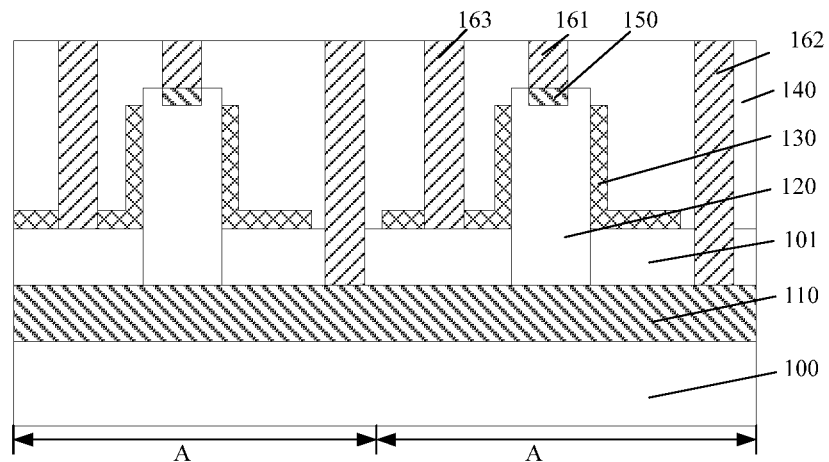
FIG. 1 illustrates a semiconductor device.

FIG. 1 illustrates a semiconductor device. As shown in FIG. 1, the semiconductor device includes a plurality of device cells. A device cell includes a semiconductor substrate 100, a first doped layer 110 on the semiconductor substrate 100, a plurality of fins 120 on the first doped layer 110, and an isolation layer 101 on the first doped layer 110. The isolation layer 101 covers portions of sidewall surfaces of the fins 120. The semiconductor device also includes a gate structure 130 on the isolation layer 101 by covering portions of the sidewall surfaces of the fins 120, a second doped layer 150 on the top surfaces of the fins 120, and a dielectric layer 140 on the isolation layer 101, the gate structure 130 and the fins 120. The dielectric layer 140 covers the top surfaces of the fins 120. Further, the semiconductor device includes a first conductive structure 161, a second conductive structure 162 and a third conductive structure 163 in the dielectric layer 140. The first conductive structure 161 is electrically connected to the second doped layer 150; the second conductive structure 162 is electrically connected to the first doped layer 110; and the third conductive structure 163 is electrically connected to the gate structure 130.

Two adjacent device cells of a semiconductor device is shown in FIG. 1. In the device cells of the semiconductor device, the gate structure 130 is separated from the first doped layer 110 by the isolation layer 101, and the minimum distance between the gate structure 130 and the first doped layer 110 is the thickness of the isolation layer 101. The portions of the isolation layer 101 in all device cells have a same thickness, and the sizes of the fins 120 between the gate structure 130 and the first doped layer 110 are the same, and the channels between the gate structure 130 and the first doped layer 110 are the same. Because the resistances are the same, the threshold voltages of the corresponding device cells are the same, it is difficult to form a semiconductor device with different threshold voltages. Accordingly, the performance of the semiconductor device may not be as desired.

The present disclosure provides a semiconductor device and a method for forming a semiconductor device. The method for forming the semiconductor device may include providing a semiconductor substrate. The semiconductor substrate may include a first device region and a second device region. The method may also include forming a first doped layer on the semiconductor substrate; forming a first fin layer, a first gate structure and a first isolation layer on the first device region of the first doped layer. The first fin layer may be formed on the first doped layer, and the first isolation layer may cover portions of the sidewall surfaces of the first fin layer and a portion of the first doped layer. The first gate structure may cover portions of the sidewall surfaces of the first fin layer and a portion of the first isolation layer. Further, the method may include forming a second fin layer, a second gate structure and a second isolation layer on the portion of the first doped layer in the second device region. The second fin layer may be formed on the first doped layer. The second isolation layer may cover portions of the sidewall surfaces of the second fin layer and the first doped layer. The second gate structure may cover portions of the sidewall surfaces the fin layer and a portion of the second isolation layer. The minimum distance between the first gate structure and the first doped layer may be the thickness of the first isolation layer. The minimum distance between the second gate structure and the first doped layer may the thickness of the second isolation layer. The thickness of the second isolation layer may be less than the thickness of the first isolation layer, and the threshold voltage of the transistor formed in the first device region may be higher than the threshold voltage of the transistor formed in the second device region to realize a semiconductor device with different threshold voltages. The method may improve the performance of the semiconductor device.

Figure 12:
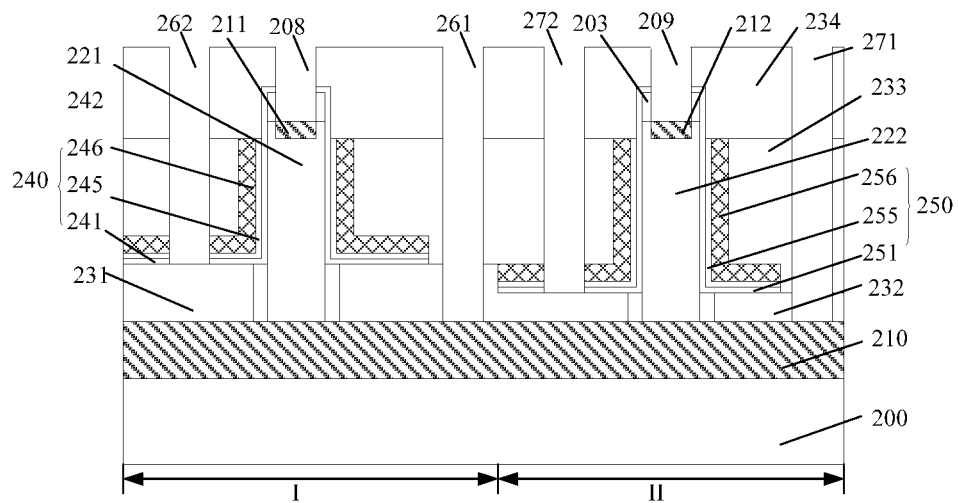
Figure 13:
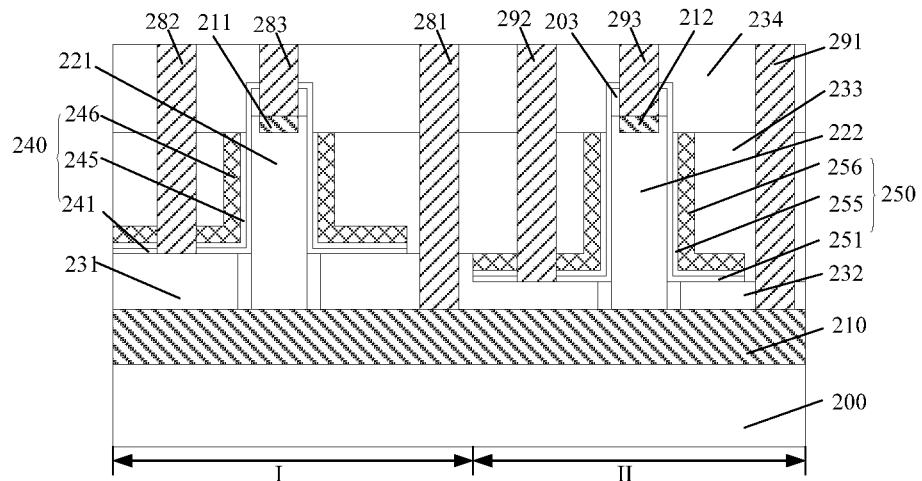
Figure 14:
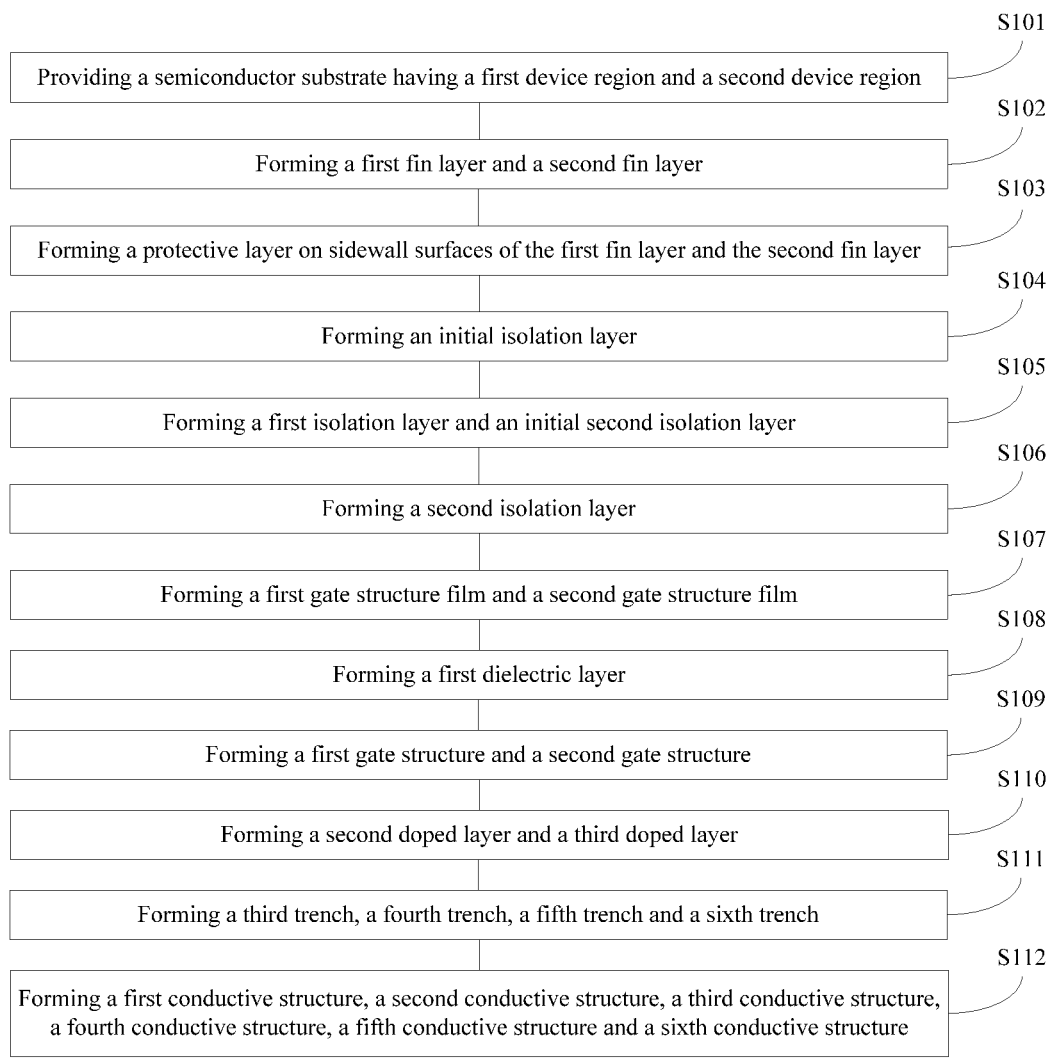
FIG. 14 illustrates an exemplary fabrication process of a semiconductor device consistent with various disclosed embodiments of the present disclosure.

FIG. 14 illustrates an exemplary process for forming a semiconductor device consistent with various disclosed embodiments of the present disclosure. FIGS. 2-13 illustrate structures corresponding to certain stages during the exemplary fabrication process of the semiconductor device consistent with various disclosed embodiments of the present disclosure.

Figure 2:
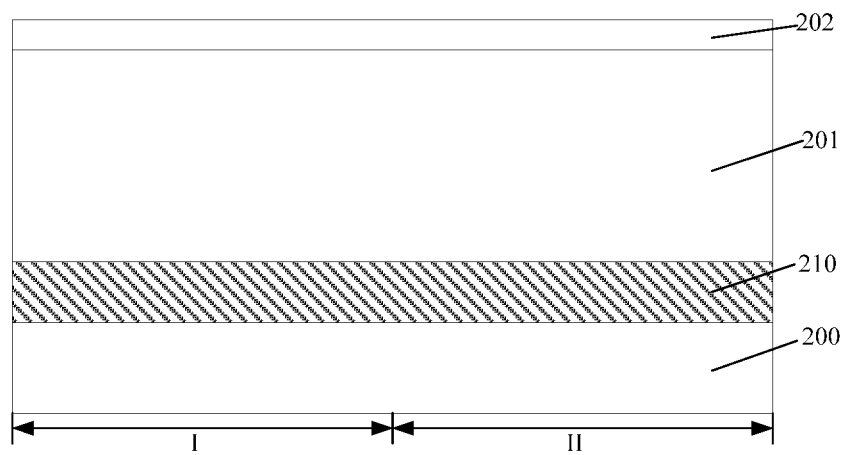
FIGS. 2-13 illustrate structures corresponding to certain stages during an exemplary fabrication process of a semiconductor device consistent with various disclosed embodiments of the present disclosure.

As shown in FIG. 14, at the beginning of the fabrication process, a semiconductor substrate with certain structures is provided (S101). FIG. 2 illustrates a corresponding semiconductor structure.

As shown in FIG. 2, a semiconductor substrate 200 is provided. The semiconductor substrate 200 may include a first device region I and a second device region II. The first device region I and the second device region II may be used to form PMOS transistors or NMOS transistors. In one embodiment, the first device region I and the second device region II are used to form PMOS transistors.

In one embodiment, the semiconductor substrate 200 may also include a third device region (not shown).

The semiconductor substrate 200 may be made of single crystal silicon, polycrystal silicon, or amorphous silicon. The semiconductor substrate 200 may also be made of other semiconductor material, such as germanium, silicon germanium, or gallium arsenide, etc. In one embodiment, the semiconductor substrate 200 is made of single crystal silicon.

Further, a first doped layer 210 may be formed on the semiconductor substrate 200. The first doped layer 210 may cover the surface of the first device region I and the surface of the second device region II of the semiconductor substrate 200. In one embodiment, the first doped layer 210 may also cover the surface of the third device region of the semiconductor substrate 200.

The first doped layer 210 may be a material layer of the doped source/drain layer of the transistors. In particular, the first doped layer 210 may be used as the sources/drains of the transistors formed in the first device region I and the second device region II. In one embodiment, the first doped layer 210 is used as sources of the transistors formed in the first device region I and the second device region II.

Further, a fin film 201 may be formed on a surface of the first doped layer 210. The fin film 201 may provide a material layer for subsequently forming a first fin layer and a second fin layer.

The fin film 201 may be made of any appropriate material. In one embodiment, the fin film 201 is made of single crystal silicon.

In one embodiment, a fin protection film 202 may be formed on the surface of the fin film 201. The fin protection film 202 may provide a layer of material for subsequently forming a fin protection layer. At the same time, the fin protection film 202 may protect the first fin layer and the second fin layer during the process for forming the first fin layer and the second fin layer.

The fin protection film 202 may be made of any appropriate material, such as silicon nitride, silicon boronitride, silicon oxycarbonitride, or silicon oxynitride, etc. In one embodiment, the fin protection film 202 is made of silicon nitride.

Figure 3:
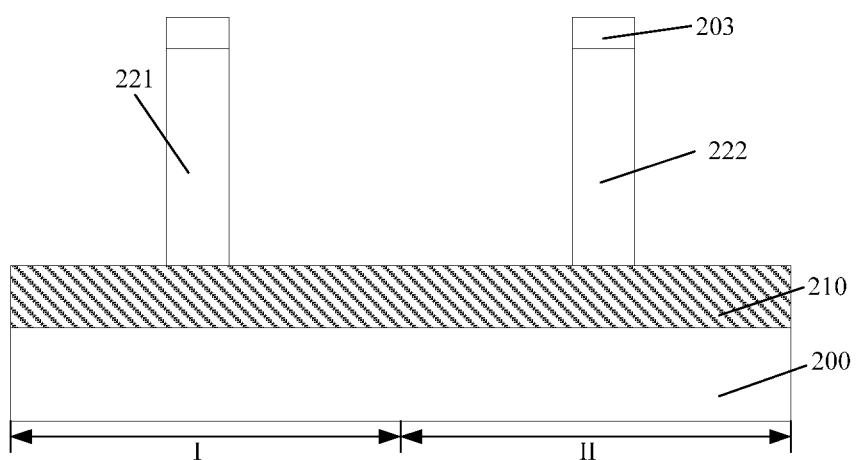

Returning to FIG. 14, after forming the fin protection layer, a first fin layer and a second fin layer may be formed (S102). FIG. 3 illustrates a corresponding semiconductor structure.

As shown in FIG. 3, a first fin layer 221 may be formed on the first doped layer 210 in the first device region I; and a second fin layer 222 may be formed on the first doped layer 210 in the second device region II.

In one embodiment, the second fin layer 222 is formed when forming the first fin layer 221.

The method for forming the first fin layer 221 and the second fin layer 222 may include forming a patterned layer (not shown) on the fin film 201 to cover a portion of the fin film 201; and etching the fin film 201 using the patterned layer as an etching mask until the surface of the first doped layer 210 is exposed. Thus, the first fin layer 221 may be formed on the first device region I; and the second fin layer 222 may be formed on the second device region II.

In one embodiment, the patterned layer is formed on the surface of the fin protection film 202, and the patterned layer may expose a portion of the fin protection film 202. The fin protection film 202 and the fin film 201 may be etched to form a fin protection layer 203 on the top surface of the first fin layer 221 and the top surface of the second fin layer 222.

The fin protection layer 203 may be used to protect the first fin layer 221 and the second fin layer 222. In one embodiment, the fin protection layer 203 is made of silicon nitride.

In one embodiment, the patterned layer is a photoresist layer. After forming the first fin layer 221 and the second fin layer 222, the patterned layer may be removed. The patterned layer may be removed by any appropriate process, such as an ashing process, etc.

In one embodiment, the first fin layer 221 and the second fin layer 222 are made of single crystal silicon. In some embodiments, the first fin layer 221 and the second fin layer 222 may be formed by different processes.

In one embodiment, a third fin layer may be formed on the first doped layer 210 in the third device region.

Figure 4:
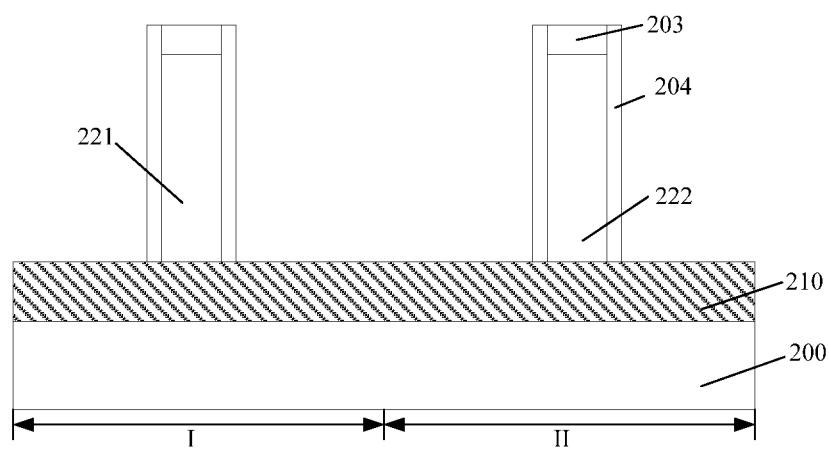

Returning to FIG. 14, after forming the first fin layer and the second fin layer, a protective layer may be formed (S103). FIG. 4 illustrates a corresponding semiconductor structure.

As shown in FIG. 4, a protective layer 204 may be formed on sidewall surfaces of the first fin layer 221 and sidewall surfaces of the second fin layer 222. The protective layer 204 may protect the first fin layer 221 and the second fin layer 222 when a dielectric layer is subsequently formed.

The method for forming the protective layer 204 may include forming an initial protective layer (not shown) on the first doped layer 210 to cover the surface of the first fin layer 221 and the surface of the second fin layer 222; and etching back the initial protective layer to expose the surface of the first doped layer 210 to form the protective layer 204.

The protective layer 204 may be made of any appropriate material, such as silicon nitride, silicon boronitride, or silicon oxynitride, etc.

After forming the first fin layer and the second fin layer, a first isolation layer may be formed on the first doped layer in the first device region. The first isolation layer may cover portions of the sidewall surfaces of the first fin layer. Then, a second isolation layer may be formed on the first doped layer in the second device region. The second isolation layer may cover portions of the sidewall surfaces of the second fin layer. The thickness of the second isolation layer may be smaller than the thickness of the first isolation layer.

The method for forming the first isolation layer may include forming a first mask layer on the first doped layer in the second device region; forming an initial first isolation layer on the first doped layer in the first device region and on the first mask layer in the second device region to cover the sidewall surfaces of the first fin layer; and etching back the initial first isolation layer to form the first isolation layer.

The method for forming the second isolation layer may include forming a second mask layer on the first doped layer in the first device region; forming an initial second mask layer on the first doped layer in the second device region and on the second mask layer in the first device region to cover the sidewall surfaces of the first fin layer; and etching back the initial second isolation layer to form the second isolation layer.

In some embodiments, after forming the first isolation layer, the second isolation layer may be formed. In other embodiments, after forming the second isolation layer, the first isolation layer may be formed.

In one embodiment, the second isolation layer is formed after forming the first isolation layer. The detailed process for forming the first isolation layer and the second isolation layer is described with the reference to FIGS. 5-7.

Figure 5:
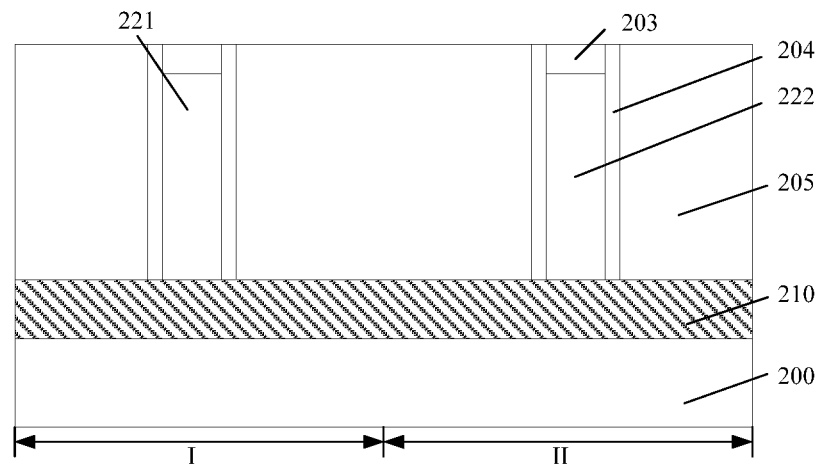

In particular, returning to FIG. 14, after forming the first fin layer and the second fins layer, an initial isolation layer may be formed (S104). FIG. 5 illustrates a corresponding semiconductor structure.

As shown in FIG. 5, an initial isolation layer 205 may be formed on the first doped layer 210; and the initial isolation layer 205 may cover the sidewall surfaces of the first fin layer 221 and the second fin layer 222. Further, the top surface of the initial isolation layer 205 may level with the top surfaces of the first fin layer 221 and the second fin layer 222. The initial isolation layer 205 may provide a material layer for subsequently forming a first isolation layer and a second isolation layer.

The method for forming the initial isolation layer 205 may include forming an initial isolation film (not shown) on the first doped layer 210 to cover the top surfaces of the first fin layer 221 and the second fin layer 222. Then, the initial isolation film may be planarized until the top surfaces of the first fin layer 221 and the second fin layer 222 are exposed, and the initial isolation layer 205 may be formed on the first doped layer 210.

The initial isolation film may be formed by a deposition process, such as a fluid chemical vapor deposition (FCVD) process, etc. The initial isolation film formed by an FCVD process may have a desired filling performance.

The initial isolation layer 205 may be made of any appropriate material, such as silicon oxide, silicon nitride, silicon boronitride, silicon oxycarbonitride, or silicon oxynitride, etc. In one embodiment, the initial isolation layer 205 is made of silicon oxide.

Figure 6:
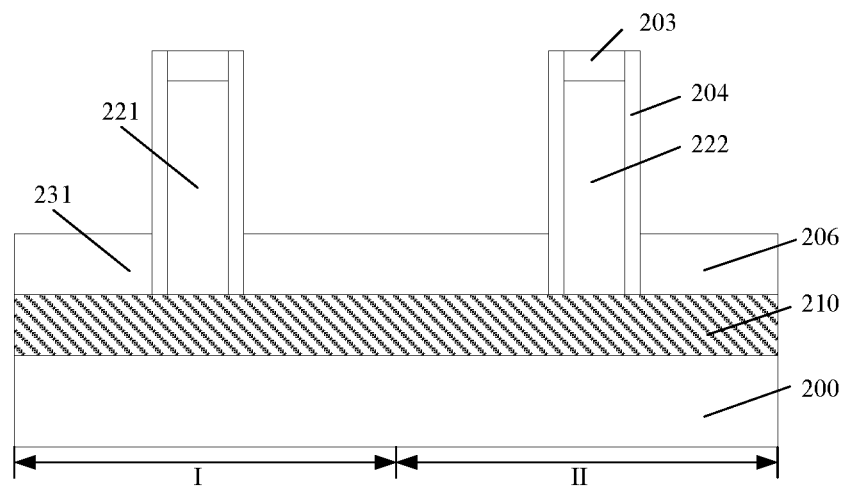

Returning to FIG. 14, after forming the initial isolation layer, a first isolation layer and an initial second isolation layer may be formed (S105). FIG. 6 illustrates a corresponding semiconductor structure.

As shown in FIG. 6, a first isolation layer 231 may be formed on the surface of the first doped layer 210 in the first device region I. Further, an initial second isolation layer 206 may be formed on the surface of the first doped layer 210 in the second device region II. The first isolation layer 231 and the initial second isolation layer 206 may be formed by etching the first initial isolation layer 205 using a first etch-back process.

The first isolation layer 231 may cover portions of the sidewall surfaces of the first fin layer 221. The initial second isolation layer 206 may cover portions of the sidewall surfaces of the second fin layer 222. The top surface of the first isolation layer 231 may level with the top surface of the initial second isolation layer 206.

The first etch-back for etching the initial isolation layer 205 may include a dry etching process, or a wet etching process, etc. The thickness of the first isolation layer 231 may be in a range of approximately 8 nm-20 nm.

A first gate structure may be subsequently formed on the first isolation layer 231, and a minimum distance between the first gate structure and the first doped layer 210 may be the thickness of the first isolation layer 231. The minimum distance between the first gate structure and the first doped layer 210 may determine the resistance between the first gate structure and the first doped layer 210. The greater the resistance between the first gate structure and the first doped layer 210 is, the greater the turn-on voltage of the transistor in the first device region is, in particular, the greater the threshold voltage of the transistor in the first device region is. Thus, changing the thickness of the first isolation layer 231 may change the threshold voltage of the transistor formed in the first device region I.

Figure 7:
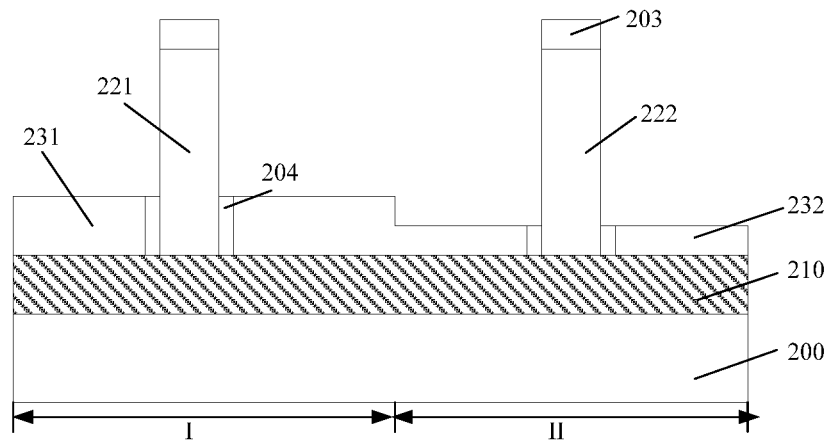

Returning to FIG. 14, after forming the first isolation layer and the initial second isolation layer, a second isolation layer may be formed (S106). FIG. 7 illustrates a corresponding semiconductor structure.

As shown in FIG. 7, a second isolation layer 232 may be formed. The second isolation layer 232 may be formed by etching the initial second isolation layer 206.

The method for forming the second isolation layer 232 may include forming a mask layer (not shown) on the first isolation layer 231 and to cover the top and sidewall surfaces of the first fin layer 221; and etching the initial second isolation layer 206 in the second device region II to form the second isolation layer 232.

A second gate structure may be subsequently formed on the second isolation layer 232; and a minimum distance between the second gate structure and the first doped layer 210 may be the thickness of the second isolation layer 232. The minimum distance between the second gate structure and the first doped layer 210 may determine the resistance between the second gate structure and the first doped layer 210. The greater the resistance between the second gate structure and the first doped layer 210 is, the greater the turn-on voltage of the transistor in the second device region is, in particular, the greater the threshold voltage of the transistor in the second device region is. Thus, changing the thickness of the second isolation layer 232 may change the threshold voltage of the transistor formed in the second device region II.

The thickness of the second isolation layer 232 may be smaller than the thickness of the first isolation layer 231. In particular, the thickness of the second isolation layer 232 may be in a range of approximately 4 nm-16 nm.

The thickness of the second isolation layer 232 may be smaller than the thickness of the first isolation layer 231. The resistance between the first gate structure and the first doped layer 210 may be greater than the resistance between the second gate structure and the first doped layer 210. Accordingly, the threshold voltage of the transistor formed in the first device region I may be higher than the threshold voltage of the transistor formed in the second device region II. Thus, a semiconductor device with different threshold voltages may be realized; and the performance of the semiconductor device may be improved.

In one embodiment, after forming the first isolation layer 231 and the second isolation layer 232, the protective layer 204 on the surface of the first fin layer 221 exposed by the first isolation layer 231 may be removed; and the protective layer 204 on the surface of the second fin layer 222 exposed by the second isolation layer 232 may be removed.

Further, in one embodiment, a third isolation layer may be formed on the first doped layer in the third device region. The third isolation layer may cover portions of the sidewall surfaces of the third fin layer. The thickness of the third isolation layer may be less than the thickness of the second isolation layer.

The thickness of the third isolation layer in the third device region may be smaller than the thickness of the second isolation layer. Thus, the resistance between the third gate structure and the first doped layer may be smaller than the resistance between the second gate structure and the first doped layer. Accordingly, the threshold voltage of the transistor formed in the third device region may be smaller than the threshold voltage of the transistor formed in the second device region. Thus, the threshold voltages of the three transistors of the semiconductor device may be different from each other; and the transistors of the semiconductor device may have more adjustable threshold voltages; and the performance of the semiconductor device may be improved.

After forming the first isolation layer 231 and the second isolation layer 232, a first gate structure may be formed on the first isolation layer 231, and the first gate structure may cover portions of the sidewall surfaces of the first fin layer 221 and a portion of a surface of the first isolation layer 231. Further, a second gate structure may be formed on the second isolation layer 232, and the second gate structure may cover portions of the sidewall surfaces of the second fin layer 222 and a portion of the surface of the second isolation layer 232.

In one embodiment, after forming the first gate structure, the second gate structure may be formed. In another embodiment, after forming the second gate structure, the first gate structure may be formed.

The top surface of the first gate structure may be lower than the top surface of the first fin layer. The top surface of the second gate structure may be lower than the top surface of the second fin layer.

The distance between the first gate structure and the top surface of the first fin layer may be referred to as a first distance. The distance between the second gate structure and the top surface of the second fin layer may be referred to as a second distance. In one embodiment, the first distance may be substantially equal to the second distance.

In one embodiment, the second gate structure is formed during the formation of the first gate structure. The detailed method for forming the first gate structure and the second gate structure may be referred to FIGS. 8-10.

Figure 8:
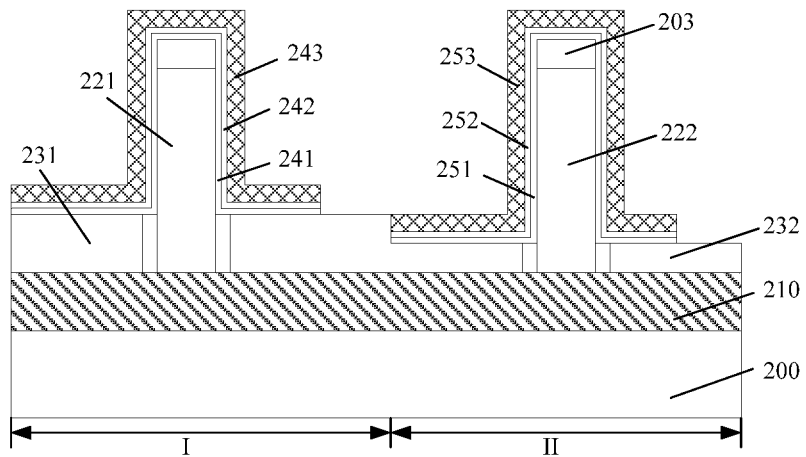

In particular, returning to FIG. 14, after forming the second insolation layer, a first gate structure film and a second gate structure film may be formed (S107). FIG. 8 illustrates a corresponding semiconductor structure.

As shown in FIG. 8, a first gate structure film may be formed on the first isolation layer 231, and the first gate structure film may cover the top and sidewall surfaces of the first fin layer 221 and a portion of the surface of the first isolation layer 231. Further, a second gate structure film may be formed on the second isolation layer 232. The second gate structure film may cover the top and sidewall surfaces of the second fin layer 222 and a portion of the surface of the second isolation layer 232.

The first gate structure film may provide a material layer for subsequently forming a first gate structure. The second gate structure film may provide a material layer for subsequently forming a second gate structure.

The first device region I may include a first connection region and a first non-connection region. The second device region II may include a second connection region and a second non-connection region. The first gate structure film may cover the surface of the first isolation layer 231 in the first non-connection region of the first device region I. The second gate structure film may cover the surface of the second isolation layer 232 in the second non-connection region of the second device region II.

The method for forming the first gate structure film and the second gate structure film may include forming an initial gate structure film on the first isolation layer 231 and the second isolation layer 232 to cover the top surface and sidewall surfaces of the first fin layer 221, and the top surface and sidewall surfaces of the second fin layer 222; and removing the portions of the initial gate structure film on the surface of the first isolation layer 231 in the first connection region and on the surface of the second isolation layer 232 in the second connection region.

Further, as shown in FIG. 8, the first gate structure film may include a first oxide film 241, a first gate dielectric film 242, and a first gate film 243. The first oxide film 241 may cover the surface of the first isolation layer 231 in the first non-connection region and the top and sidewall surfaces of the first fin layer 221. The first gate dielectric film 242 may be formed on the surface of the first oxide film 241, and the first gate film 243 may be formed on the surface of the first gate dielectric film 242.

The second gate structure film may include a second oxide film 251, a second gate dielectric film 252, and a second gate film 253. The second oxide film 251 may cover the surface of the second isolation layer 232 in the second non-connection region and the top and sidewall surfaces of the second fin layer 222. The second gate dielectric film 252 may be formed on the surface of the second oxide film 251, and the second gate film 253 may be formed on the surface of the second gate dielectric film 252.

The material of the first oxide film 241 and the second oxide film 251 may be silicon oxide, etc. The material of the first gate dielectric film 242 and the second gate dielectric film 252 may be a high-K (K greater than 3.9) dielectric material, etc. The material of the first gate film 243 and the second gate film 253 may be a metal material, such as tungsten, etc.

Figure 9:
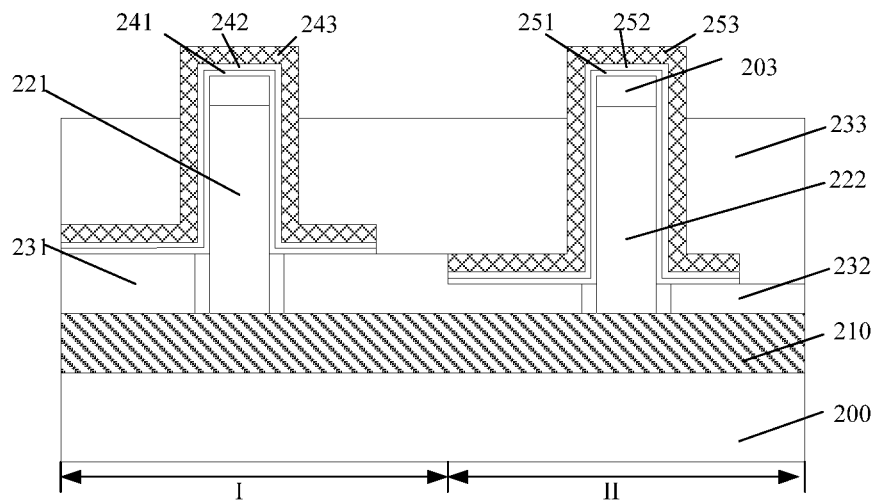

Returning to FIG. 14, after forming the first gate structure film and the second gate structure film, a first dielectric layer may be formed (S108). FIG. 9 illustrates a corresponding semiconductor structure.

As shown in FIG. 9, a first dielectric layer 233 may be formed on the first gate structure film and the second gate structure film. The first dielectric layer 233 may cover portions of the sidewall surfaces of the first fin layer 211 and portions of the sidewall surfaces of the second fin layer 222, a portion of the surface of the first isolation layer 231, and a portion of the surface of the second isolation layer 232. The top surface of the first dielectric layer 233 may be lower than the top surfaces of the first fin layer 221 and the second fin layer 222.

The method for forming the first dielectric layer 233 may include forming an initial dielectric film (not shown) on the first gate structure film and the second gate structure film and to cover a portion of the first isolation layer 231 and a portion of the second isolation layer 232, and the top surfaces of the first gate structure film and the second gate structure film; planarizing the initial dielectric film until the top surfaces of the first gate structure film and the second gate structure film are exposed to form an initial dielectric layer with top surface level with the top surfaces of the first gate structure film and the second gate structure film; and etching back the initial dielectric layer to form the first dielectric layer 233.

The distance between the top surface of the first dielectric layer 233 and the top surface of the first fin layer 221 or the distance between the top surface of the first dielectric layer 233 and the top surface of the second fin layer 222 may be referred to as a third distance. The third distance may be in a range of approximately 10 nm-35 nm.

The first fin layer 221 and the second fin layer 222 exposed by the first dielectric layer 233 may be used to subsequently form a second doped layer and a third doped layer. The first distance may be too large, and the height of the first fin layer 221 may be constant. Thus, the channel of the transistor in the first device region may be substantially short, and the performance of the semiconductor device may be not as desired. If the first distance is too small, the space for forming the second doped layer and the third doped layer may be limited, and the formed second doped layer and third doped layer may be substantially small. Accordingly, the performance of the semiconductor device may be adversely affected.

Figure 10:
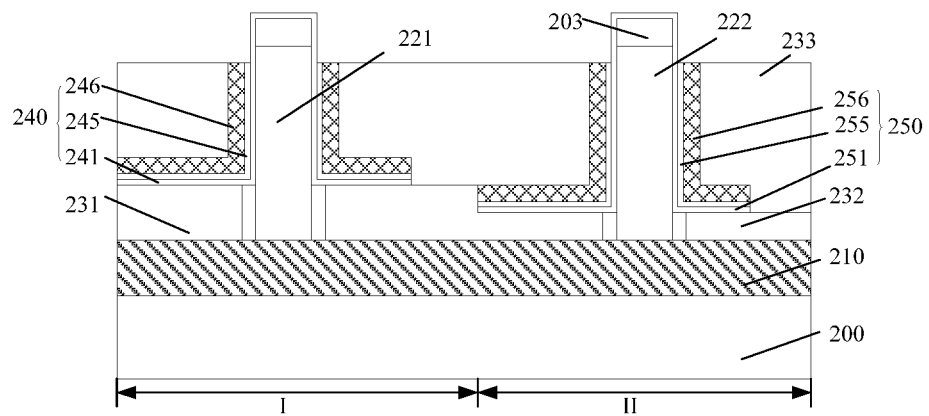

Returning to FIG. 14, after forming the first dielectric layer, a first gate structure and a second gate structure may be formed (S109). FIG. 10 illustrates a corresponding semiconductor structure.

As shown in FIG. 10, a first gate structure 240 may be formed in the first device region I; and a second gate structure 250 may be formed in the second device region II. The first gate structure 240 may be formed by removing the first gate structure film on the surface of the first fin layer 221 exposed by the first dielectric layer 233 to expose a portion of the first fin layer 221. The second gate structure 250 may be formed by removing the second gate structure film on the surface of the second fin layer 222 exposed by the first dielectric layer 233 to expose a portion of the surface of the second fin layer 222.

In one embodiment, the first gate film 243 and the first gate dielectric film 242 on the surface of the first fin layer 221 exposed by the first dielectric layer 233 may be removed, and a portion of the first oxide film 241 on the surface of the first fin layer 221 may be exposed, and the first gate structure 240 may be formed in the first device region I. Further, the first gate film 243 may be formed into a first gate layer 246; and the first gate dielectric film 242 may be formed into a first gate dielectric layer 245. The second gate film 253 and the second gate dielectric film 252 on the surface of the second fin layer 222 exposed by the first dielectric layer 233 may be removed, and a portion of the second oxide film 251 on the surface of the second fin layer 222 may be exposed to form the second gate structure 250 in the second device region II. Further, the second gate film 253 may be formed into a second gate layer 256; and the second gate dielectric film 252 may be formed into a second gate dielectric layer 255.

The first gate structure 240 may include a first oxide film 241 covering the surface of the first isolation layer 231 in the first non-connection region and the sidewall surfaces of the first fin layer 221 covered by the first dielectric layer 233, and a first gate dielectric layer 245 and a first gate layer 246. The first gate dielectric layer 245 may be formed on the surface of the first oxide film 241 covered by the first dielectric layer 233, and the first gate layer 246 may be formed on the surface of the first gate dielectric layer 245.

The second gate structure 250 may include a second oxide film 251 covering the second isolation layer 232 in the second non-connection region and the sidewall surfaces of the second fin layer 221 covered by the first dielectric layer 233, a second gate dielectric layer 255 and a second gate layer 256. The second gate dielectric layer 255 may be formed on the surface of the second oxide film 251 covered by the first dielectric layer 233, and the second gate layer 256 may be formed on the surface of the second gate dielectric layer 255.

The first oxide film 241 exposed by the first dielectric layer 233 may protect the first fin layer 221 when a second dielectric layer is subsequently formed. The second oxide film 251 exposed by the first dielectric layer 233 may protect the second fin layer 222 when the second dielectric layer is subsequently formed.

In one embodiment, a third gate structure may be formed on the third isolation layer. The third gate structure may cover portions of the sidewall surfaces of the third fin layer and a portion of the surface of the third isolation layer.

The thickness of the third isolation layer in the third device region may be smaller than the thickness of the second isolation layer, and the resistance between the third gate structure and the first doped layer may be smaller than the resistance between the second gate structure and the first doped layer. Accordingly, the threshold voltage of the transistor formed in the third device region may be smaller than the threshold voltage of the transistor formed in the second device region. Thus, the threshold voltages of the three transistors of the semiconductor device may be different, and the transistors in the semiconductor device may have more adjustable threshold voltages, and the performance of semiconductor device may be improved.

Figure 11:
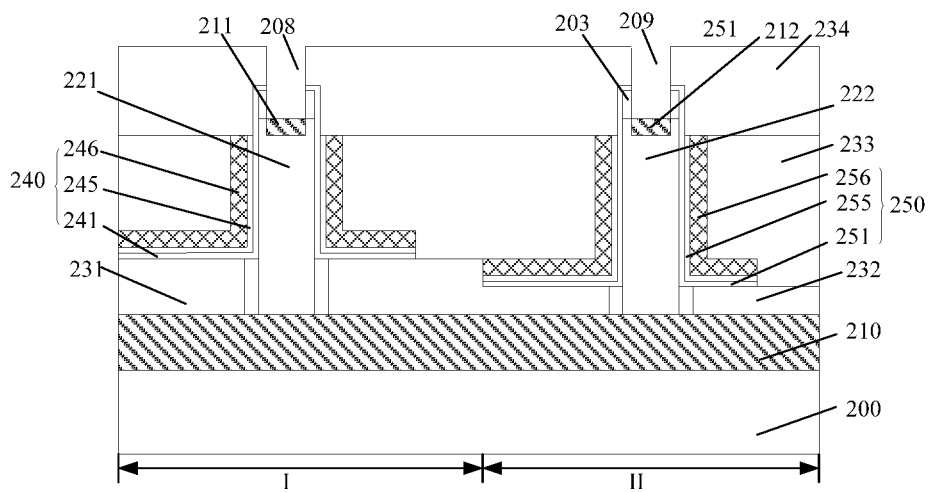

Returning to FIG. 14, after forming the first gate structure and the second gate structure, a second doped layer and a third doped layer may be formed (S110). FIG. 11 illustrates a corresponding semiconductor device.

As shown in FIG. 11, a second doped layer 211 may be formed on the top surface of the first fin layer 221. Further, a third doped layer 212 may be formed on the top of the second fin layer 222.

In one embodiment, after forming the second doped layer 211, the third doped layer 212 may be formed. In another embodiment, after the third doped layer 212 is formed, the second doped layer 211 may be formed. In some embodiments, the third doped layer 212 may be formed during forming the second doped layer 211.

The method for forming the second doped layer 211 and the third doped layer 212 may include forming a second dielectric layer 234 on the semiconductor substrate 200. The second dielectric layer 234 may cover the first gate structure 240, the first fin layer 211, the second fin layer 222 and the second gate structure 250. Then, a first trench 208 and a second trench 209 may be formed in the second dielectric layer 234. The first trench 208 may expose the first fin layer 221; and the second trench 209 may expose the second fin layer 222. Then, a first ion doping process may be performed on the first fin layer 221 at the bottom of the first trench 208 to form the second doped layer 211; and a second ion doping process may be performed on the second fin layer 222 at the bottom of the second trench 209 to form the second doped layer 212.

The first ion doping process and/or the second ion doping process may include an epitaxial growth process, an ion implantation process, or a solid state source doping process, etc. In one embodiment, the first ion doping and the second ion doping process are ion implantation processes. In particular, an ion implantation process may be performed on the first fin layer 221 at the bottom of the first recess 208 and the second fin layer 222 at the bottom of the second recess 209 to form the second doped layer 211 on the surface of the first fin layer 221 at the bottom of the first trench 208 and to form the third doped layer 212 on the surface of the second fin layer 222 at the bottom of the second trench 209.

In one embodiment, the second doped layer and the third doped layer are formed before forming the first isolation layer and the second isolation layer, the method for forming the second doped layer and the third doped layer may include performing a third ion doping process on the top of the first fin layer to form a second doped layer; and performing a fourth ion doping process on the top of the second fin layer to form a third doped layer.

The third ion doping process and/or the fourth ion doping process may include an ion implantation process, or a solid state source doping process, etc.

In one embodiment, a fourth doped layer may be formed on the top surface of the third fin layer.

Returning to FIG. 14, after forming the second doped layer and the third doped layer, a third trench, a fourth trench, a fifth trench and a sixth trench may be formed (S111). FIG. 12 illustrates a corresponding semiconductor structure.

As shown in FIG. 12, after forming the second doped layer 211 and the third doped layer 212, a third trench 261 exposing the surface of the first doped layer 210 may be formed in the first dielectric layer 233, the second dielectric layer 234, and the first isolation layer 231 in the first device region I. A fourth trench 262 exposing a portion of the surface of the first isolation layer 231 may be formed in the first dielectric layer 233 and the second dielectric layer 234 in the first device region I. A fifth trench 271 exposing the surface of the first doped layer 210 may be formed in the first dielectric layer 233, the second dielectric layer 234, and the second isolation layer 232 in the second device region II. Further, a sixth trench 272 exposing a portion of the surface of the second isolation layer 232 may be formed in the first dielectric layer 233 and the second dielectric layer 234 in the second device region II.

The third trench 261 may be formed on the first doped layer 210 in the first connection region of the first device region I. The fourth trench 262 may be formed on the surface of the isolation layer 231 in the first non-connection region of the first device region I. The fifth trench 271 may be on the surface of the first doped layer 210 in the second connection region of the second device region II. The sixth trench 272 may be formed on the surface of the second isolation layer 232 in the second non-connection region of the second device region II.

The third trench 261 may provide a space for subsequently forming a first conductive structure. The fourth trench 262 may provide a space for subsequently forming a third conductive structure. The fifth trench 271 may provide a space for subsequently forming a second conductive structure. The sixth trench 272 may provide a space for subsequently forming a fourth conductive structure.

Returning to FIG. 14, after forming the third trench, the fourth trench, the fifth trench and the sixth trench, a first conductive structure, a second conductive structure, a third conductive structure, a fourth conductive structure, a fifth conductive structure and a sixth conductive structure may be formed (S112). FIG. 13 illustrates a corresponding semiconductor structure.

As shown in FIG. 13, a fifth conductive structure 283 may be formed in the first trench 208; a sixth conductive structure 293 may be formed in the second trench 209; a first conductive structure 281 may be formed in the third trench 261; a third conductive structure 282 may be formed in the fourth trench 262; a second conductive structure 291 may be formed in the fifth trench 271; and a fourth conductive structure 292 may be formed in the sixth trench 272.

The first conductive structure 281 may be formed on the surface of the first doped layer 210 in the first connection region of the first device region I; and the first conductive structure 281 may be electrically connected to the first doped layer 210 in the first device region I. The second conductive structure 291 may be formed on the surface of the first doped layer 210 in the second connection region of the second device region II; and the second conductive structure 291 may be electrically connected to the first doped layer 210 in the second device region II. The third conductive structure 282 may be on the surface of the first isolation layer 231 in the first non-connection region of the first device region 1; and the third conductive structure 282 may be electrically connected to the first gate structure 240.

The fourth conductive structure 292 may be on the surface of the second isolation layer 232 in the second non-connection region of the second device region II; and the fourth conductive structure 292 may be electrically connected to the second gate structure 250. The fifth conductive structure 283 may be in the second dielectric layer 234 in the first device region I; and the fifth conductive structure 283 may be electrically connected to the second doped layer 211. The sixth conductive structure 293 may be formed in the second dielectric layer 234 in the first device region I; and the sixth conductive structure 293 may be electrically connected to the third doped layer 212.

The method for forming the first conductive structure 281, the second conductive structure 291, the third conductive structure 282, the fourth conductive structure 292, the fifth conductive structure 283 and the sixth conductive structure 293 may include forming an initial conductive material layer in the first trench 208, the second trench 209, the third trench 261, the fourth trench 262, the fifth trench 271, and the sixth trench 272 and on the second dielectric layer 234; and planarizing the initial conductive material layer until the top surface of the second dielectric layer 234 is exposed to form the first conductive structure 281, the second conductive structure 291, the third conductive structure 282, the fourth conductive structure 292, the fifth conductive structure 283 and the sixth conductive structure 293.

The initial conductive material layer may be made of a metal material, such as tungsten, cobalt, titanium, or nickel, etc. In one embodiment, the initial conductive material layer is made of cobalt.

Various processes may be used to form the initial conductive material layer, such as a deposition process including a chemical vapor deposition (CVD) process, a physical vapor deposition (PVD) process, or an atomic layer deposition (ALD) process, etc.

The present disclosure also provides a semiconductor device. FIG. 13 illustrates an exemplary semiconductor device consistent with various disclosed embodiments.

As shown in FIG. 13, the semiconductor device includes a semiconductor substrate 200. The semiconductor substrate 200 may include a first device region I and a second device region II. The semiconductor device may also include a first doped layer 210 on the semiconductor substrate 200; a first fin layer 221 on the first doped layer 210 in the first device region I; and a second fin layer 222 on the first doped layer 210 in the second device region II. Further, the semiconductor device may include a first isolation layer 231 on the first doped layer 210 in the first device region I. The first isolation layer 231 may cover portions of the sidewall surfaces of the first fin layer 221. Further, the semiconductor device may include a second isolation layer 232 on the first doped layer 210 in the second device region II. The second isolation layer 232 may cover portions of the sidewall surfaces of the second fin layer 222; and the second isolation layer 232 may be thinner than the first isolation layer 231. Further, the semiconductor device may include a first gate structure 240 on the first isolation layer 231. The first gate structure 240 may cover portions of the sidewall surfaces of the first fin layer 221. Further, the semiconductor device may include a second gate structure 250 on the second isolation layer 232. The second gate structure 250 may cover portions of the sidewall surfaces of the second fin layer 222. Further, the semiconductor device may include a second doped layer 211 on the first fin layer 221; and a third doped layer 222 on the second fin layer 212.

The semiconductor substrate 200, the first fin layer 221, and the second fin layer 222 may be referred to the previous description. The structures and positions of the first gate structure 240 and the second gate structure 250 may be referred to the previous description. The materials and locations of the first isolation layer 231 and the second isolation layer 232 may be referred to the previous description.

In one embodiment, the semiconductor device may also include a first conductive structure 281 formed in the first device region I; and the first conductive structure 281 may be electrically connected to the first doped layer 210 in the first device region I. The semiconductor device may also include a second conductive structure 291 formed in the second device region II; and the second conductive structure 291 may be electrically connected to the first doped layer 210 in the second device region II. The semiconductor device may also include a third conductive structure 282 formed in the first device region I; and the third conductive structure 282 may be electrically connected to the first gate structure 240. Further, the semiconductor device may include a fourth conductive structure 292 formed in the second device region II; and the fourth conductive structure 292 may be electrically connected to the second gate structure 250. Further, the semiconductor device may include a fifth conductive structure 283 formed in the first device region I; and the fifth conductive structure may be electrically connected to the second doped layer 211. Further, the semiconductor device may include a sixth conductive structure 293; and the sixth conductive structure may be electrically connected to the third doped layer 212 in the second device region II.

The materials and positions of the first conductive structure 281, the second conductive structure 291, the third conductive structure 282, the fourth conductive structure 292, the fifth conductive structure 283 and the sixth conductive structure 293 may be referred to the previous description.

In disclosed method for forming a semiconductor device, the first isolation layer may be formed between the first gate structure and the first doped layer in the first device region to isolate the first gate structure from the first doped layer. The minimum distance between the first gate structure and the first doped layer may be the thickness of the first isolation layer. Correspondingly, the minimum distance between the second gate structure and the first doped layer may be the thickness of the second isolation layer. The distance between the first gate structure and the top surface of the first fin layer may be referred to as a first distance. The distance between the second gate structure and the top surface of the second fin layer may be referred to as a second distance. The thickness of the second isolation layer may be smaller than the thickness of the first isolation layer, and the first distance may be greater than the second distance. Because the first distance may be greater than the second distance, the resistance between the first gate structure and the first doped layer may be greater than the resistance between the second gate structure and the first doped layer. Thus, the threshold voltage of the transistor formed in the first device region may be greater than the threshold voltage of the transistor formed in the second device region. Accordingly, a semiconductor device of different threshold voltages may be formed; and the performance of the semiconductor device may be improved.

Further, the semiconductor substrate may also include a third device region. The thickness of the third isolation layer in the third device region may be smaller than the thickness of the second isolation layer, and the resistance between the third gate structure and the first doped layer may be smaller than the resistance between the second gate structure and the first doped layer. Thus, the threshold voltage of the transistor formed in the third device region may be smaller than the threshold voltage of the transistor formed in the second device region. Accordingly, the threshold voltages of the three transistors of the semiconductor device may be different, and the transistors in the semiconductor device may have more adjustable threshold voltages. Thus, the performance of the semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
   providing a semiconductor substrate having a first device region and a second device region;
   forming a first doped layer on the semiconductor substrate;
   forming a first fin layer on a portion of the first doped layer in the first device region;
   forming a second fin layer on a portion of the first doped layer in the second device region;
   forming a first isolation layer on a portion of the first doped layer in the first device region and to cover portions of sidewall surfaces of the first fin layer;
   forming a second isolation layer on a portion of the first doped layer in the second device region and to cover portions of sidewall surfaces of the second fin layer and with a thickness smaller than a thickness of the first isolation layer;
   forming a first gate structure on the first isolation layer and to cover portions of the sidewall surfaces of the first fin layer and a portion of the first isolation layer;
   forming a second gate structure on the second isolation layer and to cover portions of the sidewall surfaces of the second fin layer and a portion of the second isolation layer;
   forming a second doped layer on the first fin layer; and
   forming a third doped layer on the second fin layer.

2. The method according to claim 1, further comprising:
   forming a first conductive structure in the first device region and electrically connected to a portion of the first doped layer in the first device region;
   forming a second conductive structure in the second device region and electrically connected to a portion of the first doped layer in the second device region;
   forming a third conductive structure in the first device region and electrically connected to the first gate structure;
   forming a fourth conductive structure in the second device region and electrically connected to the second gate structure;
   forming a fifth conductive structure in the first device region and electrically connected to the second doped layer; and
   forming a sixth conductive structure in the second device region and electrically connected to the third doped layer.

3. The method according to claim 1, wherein forming the first isolation layer comprises:
   forming a first mask layer on the portion of the first doped layer in the second device region;
   forming an initial first isolation layer on the portion of the first doped layer in the first device region and the first mask layer in the second device region and to cover the sidewall surfaces of the first doped layer; and
   etching back the initial first isolation layer to form the first isolation layer.

4. The method according to claim 1, wherein forming the second isolation layer comprises:
   forming a second mask layer on a portion of the first doped layer in the first device region;
   forming an initial second isolation layer on a portion of the first doped layer in the second device region and the second mask layer in first device region and to cover the sidewall surfaces of the first fin layer; and
   etching back the initial second isolation layer to form the second isolation layer.

5. The method according to claim 1, wherein the second isolation layer is formed after forming the first isolation layer, wherein forming the first isolation layer and the second isolation layer comprises:
   forming an initial isolation film on the first doped layer and to cover top surfaces of the first doped layer and the second doped layer;
   planarizing the initial isolation film until the top surfaces of the first doped layer and the second doped layer are exposed to form an initial isolation layer on the first doped layer, wherein a top surface of the initial isolation layer levels with top surfaces of the first fin layer and the second fin layer;
   etching back the initial isolation layer to form the first isolation layer on the portion of the first doped layer in the first device region and an initial second isolation layer on the portion of the first doped layer in the second device region, wherein the first isolation layer covers portions of the sidewall surfaces of the first fin layer and the initial second isolation layer covers portions of sidewall surfaces of the second fin layer; and a top surface of the first isolation layer levels with a top surface of the initial second isolation layer; and
   etching the initial second isolation layer to form the second isolation layer.

6. The method according to claim 1, wherein:
   a top surface of the first gate structure is lower than a top surface of the first fin layer; and
   a top surface of the second gate structure is lower than a top surface of the second fin layer.

7. The method according to claim 1, after forming the first gate structure and the second gate structure, further comprising:
forming a second doped layer and a third doped layer, wherein the second doped layer and the third doped layer are formed by:
forming a dielectric layer on the semiconductor substrate and to cover the first gate structure, the first fin layer, the second fin layer and the second gate structure;
forming a first trench in the dielectric layer and to expose the first fin layer and a second trench in the dielectric layer and to expose the second fin layer;
performing a first ion doping process on the first fin layer on a bottom of the first trench to form the first doped layer; and
performing a second ion doping process on the second fin layer on a bottom of the second trench to form the third doped layer.

8. The method according to claim 7, wherein:
the first ion doping process includes one of an epitaxial growth process, an ion implantation process and a solid-state doping process; and
the second ion doping process includes one of an epitaxial growth process, an ion implantation process and a solid-state doping process.

9. The method according to claim 1, wherein the second doped layer and the third doped layer are formed before forming the first isolation layer and the second isolation layer, wherein the second doped layer and the third doped layer are formed by:
performing a third ion doping process on a top surface of the first fin layer to form the second doped layer; and
performing a fourth ion doping process on a top surface of the second fin layer to form the third doped layer.

10. The method according to claim 9, wherein:
the third ion doping process includes one of an ion implantation process and a solid-state source doping process; and
the fourth ion doping process includes one of an ion implantation process and a solid-state source doping process.

11. The method according to claim 1, wherein the second gate structure is formed when forming the first gate structure, wherein forming the first gate structure and the second gate structure comprises:
forming a first gate structure film on the first isolation layer and to cover top and sidewall surfaces of the first fin layer and a portion of the first isolation layer;
forming a second gate structure film on the second isolation layer and to cover top and sidewall surfaces of the second fin layer and a portion of the second isolation layer;
forming a first dielectric layer on the first gate structure and the second gate structure and to cover portions of the sidewall surfaces of the first fin layer, portions of the sidewall surfaces of the second fin layer, a portion of the first isolation layer and a portion of the second isolation layer and with a surface lower than top surfaces of the first fin layer and the second fin layer;
removing a portion of the first gate structure film on the first fin layer and exposed by the first dielectric layer to expose a portion of the first fin layer to form the first gate structure in the first device region; and
removing a portion of the second gate structure film on the second fin layer and exposed by the first dielectric layer to expose a portion of the second fin layer to form the second gate structure in the second device region.

12. The method according to claim 11, wherein forming the first dielectric layer comprises:
forming an initial dielectric film on the first gate structure film and the second gate structure film and to cover portions of the first isolation layer and the second isolation layer and to cover top surfaces of the first gate structure film and the second gate structure film;
planarizing the initial dielectric film until the top surfaces of the first gate structure film and the second gate structure film are exposed to form an initial first dielectric layer with a top surface level with the top surfaces of the first gate structure film and the second gate structure film; and
etching back the initial dielectric film to form the first dielectric layer.

13. The method according to claim 11, wherein:
a distance between a top surface of the first dielectric layer and a top surface of the first fin layer is in a range of approximately 10 nm-35 nm.

14. The method according to claim 1, before forming the first isolation layer and the second isolation layer and after forming the first fin layer and the second fin layer, further comprising:
forming a protective layer on sidewall surfaces of the first fin layer and the second fin layer; and
removing portions of the protective layer on the sidewall surfaces of the first fin layer and exposed by the first isolation layer and removing portions of the protective layer on the sidewall surfaces of the second fin layer and exposed by the second isolation layer after forming the first isolation layer and the second isolation layer.

15. The method according to claim 1, wherein the semiconductor substrate further includes a third device region, further comprising:
forming a third fin layer on a portion of the first doped layer in the third device region;
forming a third isolation layer on a portion of the first doped layer in the third device region and to cover portions of sidewall surfaces of the third fin layer and with a thickness smaller than the thickness of the second isolation layer;
forming a third gate structure on the third isolation layer and to cover the portions of the sidewall surfaces of the third isolation layer and a portion of the third isolation layer; and
forming a fourth doped layer on a top surface of the third fin layer.

16. A semiconductor device, comprising:
a semiconductor substrate having a first device region and a second device region;
a first doped layer formed on the semiconductor substrate;
a first fin layer formed on a portion of the first doped layer in the first device region;
a second fin layer formed on a portion of the first doped layer in the second device region;
a first isolation layer formed on a portion of the first doped layer in the first device region and covering portions of sidewall surfaces of the first fin layer;
a second isolation layer formed on a portion of the first doped layer in the second device region and covering portions of the sidewall surfaces of the second fin layer and with a thickness smaller than a thickness of the first isolation layer;
a first gate structure formed on the first isolation layer and covering portions of sidewall surfaces of the first fin layer and a portion of the first isolation layer;

a second gate structure formed on the second isolation layer and covering portions of sidewall surfaces of the first fin layer and a portion of the second isolation layer;

a second doped layer formed on the first fin layer; and a third doped layer formed on the second fin layer.

17. The semiconductor device according to claim 16, further comprising:

a first dielectric layer covering portions of sidewall surfaces of the first fin layer, portions of sidewall surfaces of the second fin layer, a portion of the first isolation layer and a portion of sidewall surfaces of the second isolation layer and with a top surface lower than top surfaces of the first fin layer and the second fin layer.

18. The semiconductor device according to claim 17, further comprising:

a second dielectric layer formed over the semiconductor substrate and covering the first gate structure, the second gate structure, the first fin layer and the second fin layer.

19. The semiconductor device according to claim 16, wherein the semiconductor substrate includes a third device region, further comprising:

a third fin layer formed on a portion of the first doped layer in the third device region;

a third isolation layer formed on a portion of the first doped layer in the third device region and covering portions of sidewall surfaces of the third fin layer and with a thickness smaller than the thickness of the second isolation layer; and a fourth doped layer formed on the third fin layer.

20. The semiconductor device according to claim 16, wherein:

a distance between a top surface of the second fin layer and the surface of the semiconductor substrate is in a range of approximately 1000 angstroms to 1500 angstroms; and a distance between a top surface of the first fin layer and the surface of the semiconductor substrate is in range of approximately 600 angstroms to 900 angstroms.

* * * * *